US012615948B2

(12) United States Patent

Wang et al.

(10) Patent No.: US 12,615,948 B2

(45) Date of Patent: Apr. 28, 2026

(54) DISPLAY PANEL AND DISPLAY APPARATUS

(71) Applicant: BOE TECHNOLOGY GROUP CO., LTD., Beijing (CN)

(72) Inventors: Pinfan Wang, Beijing (CN); Ce Xu, Beijing (CN); Yanyan Yang, Beijing (CN); Bingwei Wang, Beijing (CN); Haoran Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 400 days.

(21) Appl. No.: 18/257,135

(22) PCT Filed: Jul. 26, 2022

(86) PCT No.: PCT/CN2022/108036

§ 371 (c)(1),
(2) Date: Jun. 13, 2023

(87) PCT Pub. No.: WO2024/020806

PCT Pub. Date: Feb. 1, 2024

(65) Prior Publication Data

US 2024/0381741 A1 Nov. 14, 2024

(51) Int. Cl.
*H10K 59/80* (2023.01)
(52) U.S. Cl.
CPC ................................. *H10K 59/873* (2023.02)
(58) Field of Classification Search
CPC ....... G09F 9/30; H10K 59/873; H10K 59/131
See application file for complete search history.

(56) References Cited

U.S. PATENT DOCUMENTS

| | | | | |
|---|---|---|---|---|
| 2020/0170126 A1* | 5/2020 | Ahn | | G06F 1/1637 |
| 2020/0176696 A1 | 6/2020 | Dai | | |
| 2021/0376006 A1* | 12/2021 | Won | | H10K 77/10 |
| 2021/0384465 A1* | 12/2021 | Park | | H10K 59/873 |
| 2021/0408409 A1* | 12/2021 | Wang | | H10K 71/00 |
| 2022/0005877 A1* | 1/2022 | Seo | | H10K 59/8731 |

(Continued)

FOREIGN PATENT DOCUMENTS

| | | |
|---|---|---|
| CN | 108766977 A | 11/2018 |
| CN | 111221163 A | 6/2020 |

(Continued)

*Primary Examiner* — Vongsavanh Sengdara

(74) *Attorney, Agent, or Firm* — XSENSUS LLP

(57) ABSTRACT

A display panel includes a first display portion and at least one second display portion. The first display portion includes first sub-pixels and has at least one arc-shaped border. The second display portion is connected to an arc-shaped border and includes first sub-portions and one or more second sub-portions. The first sub-portion includes second sub-pixels, the first sub-portions are sequentially arranged along the arc-shaped border, and in a case where the first display portion and the second display portion are laid on a reference plane, any two adjacent first sub-portions have a gap therebetween. The second sub-portion includes third sub-pixels; at least one second sub-portion is located in a gap between two adjacent first sub-portions and is connected to at least one of the two adjacent first sub-portions. A Young's modulus of the first sub-portion is greater than a Young's modulus of the second sub-portion.

19 Claims, 9 Drawing Sheets

(56)  References Cited

U.S. PATENT DOCUMENTS

| | | | |
|---|---|---|---|
| 2022/0052137 A1* | 2/2022 | Song | H10K 59/873 |
| 2022/0052141 A1* | 2/2022 | Lee | H10K 59/123 |
| 2022/0069051 A1* | 3/2022 | Lee | H10K 59/122 |
| 2022/0077242 A1* | 3/2022 | Yoon | G06F 1/1637 |
| 2022/0123064 A1* | 4/2022 | Cao | H10K 59/80 |
| 2022/0149118 A1* | 5/2022 | Kim | H10K 59/131 |
| 2022/0149324 A1* | 5/2022 | Park | H10K 59/8731 |
| 2023/0111683 A1 | 4/2023 | Wang et al. | |

FOREIGN PATENT DOCUMENTS

| | | | |
|---|---|---|---|
| CN | 111710245 A | 9/2020 |
| CN | 112234090 A | 1/2021 |
| CN | 113764469 A | 12/2021 |
| CN | 114551521 A | 5/2022 |

* cited by examiner

P1

DISPLAY PANEL AND DISPLAY APPARATUS

CROSS-REFERENCE TO RELATED APPLICATION

This application is a national phase entry under 35 USC 371 of International Patent Application No. PCT/CN2022/108036 filed on Jul. 26, 2022, which is incorporated herein by reference in its entirety.

TECHNICAL FIELD

The present disclosure relates to the field of display technologies, and in particular, to a display panel and a display apparatus.

BACKGROUND

With the development of flexible organic light-emitting display apparatuses (organic light-emitting diode, OLED), forms of the display apparatuses have become increasingly diverse. For example, a display surface of a display apparatus can be made into a curved surface or a spherical surface. To achieve the above display apparatus, it is required that the display panel therein is capable of being stretched or compressed at at least some positions, so as to meet display requirements of the display panel for different curved surfaces.

SUMMARY

In an aspect, a display panel is provided. The display panel includes a first display portion and at least one second display portion. The first display portion includes a plurality of first sub-pixels and has at least one arc-shaped border. The second display portion is connected to an arc-shaped border of the first display portion and includes a plurality of first sub-portions and one or more second sub-portions. The first sub-portion includes a plurality of second sub-pixels. The plurality of first sub-portions are sequentially arranged along the arc-shaped border. In a case where the first display portion and the second display portion are laid on a reference plane, any two adjacent first sub-portions have a gap therebetween. The second sub-portion includes a plurality of third sub-pixels; at least one second sub-portion is located in a gap between two adjacent first sub-portions and is connected to at least one of the two adjacent first sub-portions. A Young's modulus of the first sub-portion is greater than a Young's modulus of the second sub-portion.

In some embodiments, a dimension of the at least one second sub-portion along a first direction is less than or equal to a dimension of the gap between the two adjacent first sub-portions along the first direction, where the first direction is substantially parallel to a tangential direction of the arc-shaped border.

In some embodiments, the second sub-portion is provided therein with a plurality of opening holes, and the plurality of opening holes are located between the plurality of third sub-pixels.

In some embodiments, the second sub-portion has a plurality of island regions and a plurality of bridge regions, and two adjacent island regions are connected by at least one bridge region therebetween; and the opening holes are arranged between adjacent island regions, between adjacent bridge regions, and between island regions and bridge regions that are adjacent. The plurality of third sub-pixels are distributed in the plurality of island regions. The second sub-portion further includes a plurality of signal lines, each third sub-pixel is electrically connected to at least one signal line, and the plurality of signal lines are distributed in the plurality of bridge regions.

In some embodiments, one second sub-portion is arranged between the two adjacent first sub-portions, and the one second sub-portion is connected to two side edges, proximate to each other, of the two adjacent first sub-portions.

In some embodiments, along a second direction and away from the first display portion, a dimension of the one second sub-portion along the first direction increases, where the first direction is substantially parallel to a tangential direction of the arc-shaped border, and the second direction is substantially parallel to a radial direction of the arc-shaped border.

In some embodiments, along a first direction and from each of the two adjacent first sub-portions to a center line of the one second sub-portion, a dimension of the one second sub-portion along a second direction decreases, where the first direction is substantially parallel to a tangential direction of the arc-shaped border, and the second direction is substantially parallel to a radial direction of the arc-shaped border.

In some embodiments, a border of the one second sub-portion away from the first display portion has a V-shape or an arc-shape, and along a direction from the border of the second sub-portion to the arc-shaped border, the border of the second sub-portion is concave.

In some embodiments, two second sub-portions are arranged between the two adjacent first sub-portions, and each second sub-portion is connected to a first sub-portion adjacent thereto; and in the case where the first display portion and the second display portion are laid on the reference plane, the two second sub-portions have a gap therebetween.

In some embodiments, along a second direction and away from the first display portion, a dimension of the gap between the two second sub-portions along the first direction increases, where the second direction is substantially parallel to a radial direction of the arc-shaped border, and the second direction is substantially parallel to a radial direction of the arc-shaped border.

In some embodiments, a dimension of the first sub-portion along a first direction is substantially constant, where the first direction is substantially parallel to a tangential direction of the arc-shaped border.

In some embodiments, the first display portion has a plurality of corners, and a border of each corner is an arc-shaped border in the at least one arc-shaped border; the at least one second display portion includes a plurality of second display portions, each second display portion is connected to an arc-shaped border of one of the corners. The first display portion further has a plurality of straight-line borders, and two adjacent arc-shaped borders are connected by a straight-line border therebetween. The display panel further comprises a plurality of third display portions, each third display portion is connected to a straight-line border of the plurality of straight-line borders; and in a case where the first display portion, the second display portions and the third display portions are laid on the reference plane, a second display portion and a third display portion adjacent thereto have a gap therebetween; and the third display portions each include a plurality of fourth sub-pixels.

In some embodiments, the at least one arc-shaped border includes one arc-shaped border, and the at least one second display portion includes one second display portion; and a shape of the first display portion is a closed-shape enclosed by the one arc-shaped border, and the plurality of first sub-portions and the one or more second sub-portions are arranged alternately around the first display portion and connected in sequence.

In some embodiments, a border, away from the first display portion, of each sub-portion among the plurality of first sub-portions and the one or more second sub-portions have an arc-shape, and along a direction from the arc-shaped border to the border of each sub-portion, the border of each sub-portion is convex.

In some embodiments, each third sub-pixel includes a third light-emitting device and a third pixel circuit electrically connected to the third light-emitting device. At least one third pixel circuit is arranged in the first display portion and/or a first sub-portion.

In some embodiments, the display panel further includes a plurality of scanning circuits and a plurality of control signal lines. Each scanning circuit is electrically connected to at least one third sub-pixel, and the scanning circuit is configured to turn on or turn off the at least one third sub-pixel. The plurality of control signal lines are electrically connected to the plurality of scanning circuits, and the plurality of control signal lines are configured to transmit signals required for operation to the plurality of scanning circuits. At least one scanning circuit is arranged in the first display portion and/or a first sub-portion, and/or at least one control signal line is arranged in the first display portion and/or a first sub-portion.

In some embodiments, in a case where the second display portion is laid on a reference curved surface, borders, away from the first display portion, of the plurality of first sub-portions and the one or more second sub-portions are substantially located in a same plane.

In some embodiments, a dimension of the first sub-portion along a first direction is substantially constant, or along a second direction and from the first display portion to the first sub-portion, the dimension of the first sub-portion along the first direction decreases, where the first direction is substantially parallel to a tangential direction of the arc-shaped border, and the second direction is substantially parallel to a radial direction of the arc-shaped border.

In some embodiments, the Young's modulus of the first sub-portion is less than or equal to a Young's modulus of the first display portion.

In another aspect, a display apparatus is provided. The display apparatus includes a substrate, and the display panel as described in any of the above embodiments. The substrate has a reference curved surface. The display panel is laid on the substrate, and the second display portion of the display panel is laid on the reference curved surface.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person having ordinary skill in the art can obtain other drawings according to these accompanying drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1A:
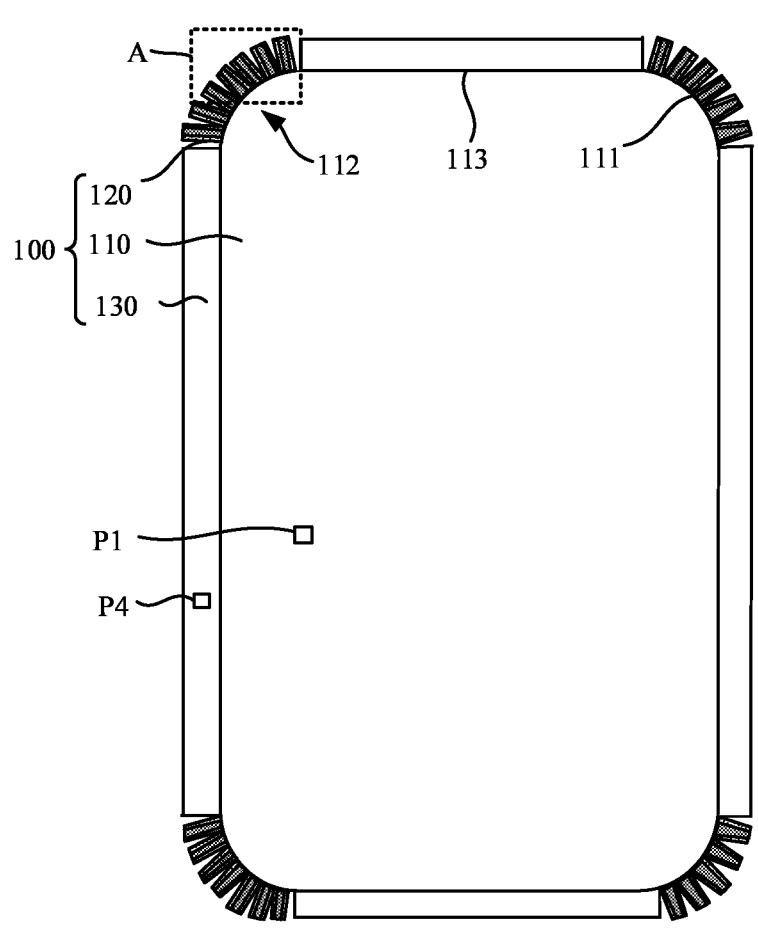
FIG. 1A is a structural diagram of a display panel in a flattened state, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person having ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive meaning, i.e., "including, but not limited to". In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above term do not necessarily refer to the same embodiment(s) or example(s). In addition, specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, the features defined with "first" and "second" may explicitly or implicitly include one or more of the features. In the description of the embodiments of the present disclosure, the term "a/the plurality of/multiple" mean two or more unless otherwise specified.

In the description of some embodiments, the expressions "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B, and C" has the same meaning as the phrase "at least one of A, B, or C", and they both include the following combinations of A, B, and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is, optionally, construed to mean "when" or "upon" or "in response to determining" or "in response to detecting", depending on the context. Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The use of the phrase "configured to" herein means an open and inclusive expression, which does not exclude devices that are adapted to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The terms such as "substantially" or "approximately" as used herein include a stated value and an average value within an acceptable range of deviation of a particular value determined by a person of ordinary skill in the art, where the acceptable deviation range is determined by a person of ordinary skill in the art in consideration of the measurement in question and the error associated with the measurement of a specific quantity (i.e., the limitation of the measurement system).

The terms "parallel", "perpendicular" and "equal" as used herein include the stated conditions and the conditions similar to the stated conditions, and the range of the similar conditions is within the acceptable deviation range, where the acceptable deviation range is determined by a person of ordinary skill in the art in consideration of the measurement in question and the error associated with the measurement of a specific quantity (i.e., the limitation of the measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, a difference between two equals of less than or equal to 5% of either of the two equals.

It will be understood that, in a case where a layer or component is referred to as being on another layer or a substrate, it may be that the layer or component is directly on the another layer or substrate; or it may be that intermediate layer(s) exist between the layer or component and the another layer or substrate.

Some embodiments of the present disclosure provide a display apparatus 1000. As shown in FIG. 1A, the display apparatus 1000 may be any apparatus that can display an image whether in motion (e.g., video) or stationary (e.g., a still image), and whether textual or pictorial. For example, the display apparatus 1000 may be any product or component with a display function such as a TV, a notebook computer, a tablet computer, a mobile phone, an electronic photo, an electronic billboard or sign, a personal digital assistant (PDA), a navigator, a wearable device, an augmented reality (AR) equipment, or a virtual reality (VR) equipment.

In some embodiments, the display apparatus 1000 may be an electroluminescence display apparatus or a photoluminescence display apparatus. In a case where the display apparatus 1000 is an electroluminescent display apparatus, the electroluminescent display apparatus may be an organic electroluminescent display apparatus (organic light-emitting diode display apparatus, OLED display apparatus) or a quantum dot electroluminescent display apparatus (quantum dot light-emitting diode display apparatus, QLED display apparatus). In a case where the display apparatus 1000 is a photoluminescence display apparatus, the photoluminescence display apparatus may be a quantum photoluminescence display apparatus (quantum dot light-emitting display apparatus, QLED display apparatus). The type of the display apparatus 1000 is not limited in the embodiments of the present disclosure.

Figure 2:
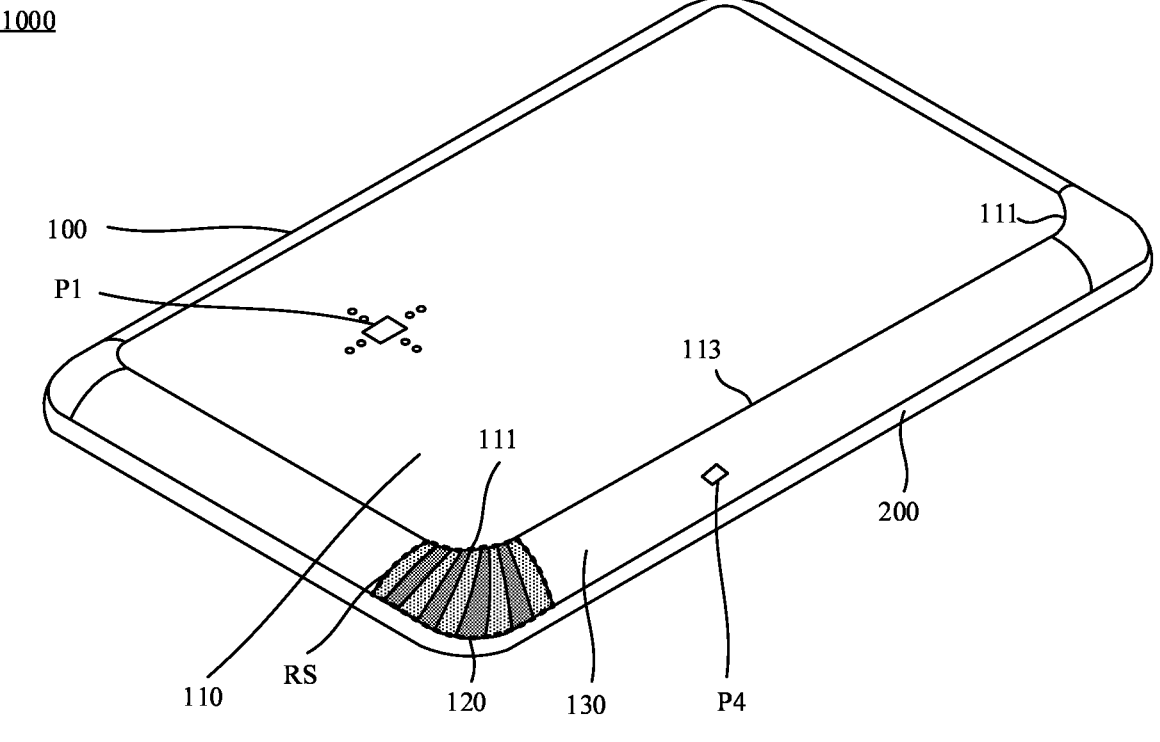
FIG. 2 is a structural diagram of a display panel in which a curved surface is formed, in accordance with some embodiments.

As shown in FIG. 2, the display apparatus 1000 includes a display panel 100 and a substrate 200. The substrate 200 has a reference curved surface RS, and the display panel 100 is laid on the substrate 200, so that the display panel 100 is capable of forming a curved surface having a same shape as the reference curved surface RS.

In some embodiments, the display panel 100 may be a flexible display panel. In this way, the display panel 100 can be bent and deformed to a certain extent, so as to meet the requirement of applying the display panel 100 to a curved display apparatus. For example, the curved display apparatus may be a curved screen, a rounded curved screen (a display apparatus having rounded corners where a curved surface at the rounded corner), a spherical screen, or the like.

In a case where the display panel 100 is a flexible display panel, the display panel 100 may include a flexible substrate. For example, a material of the flexible substrate may include one or more of polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC) and cellulose acetate propionate (CAP), which is not limited in embodiments of the present disclosure.

In a process of bending the display panel 100 from a plane state to form a curved surface, the display panel 100 needs to have a certain amount of deformation, and these deformations may be stretching deformation or compressive deformation.

In order to make a display panel deform to a certain extent and reduce stress on the display panel during the deformation process, a portion, configured to provide a curved surface, of the display panel will be cut to form a plurality of strip-shaped extending portions at intervals. In a case where the display panel is in a flattened state, adjacent strip-shaped extending portions have a gap therebetween. However, since there are gaps in the display panel, after a curved surface is formed on the display panel, the two adjacent strip-shaped extending portions may still have a gap therebetween or may have an overlapping portion therebetween, resulting in abnormal display of the display panel.

In order to solve the above technical problems, embodiments of the present disclosure provide a display panel 100, referring to FIG. 1A to FIG. 4, the display panel 100 includes a first display portion 110 and second display portion(s) 120.

The display portion 110 includes a plurality of first sub-pixels P1. The first sub-pixel P1 refers to a basic unit for displaying image information. For example, the first sub-pixels P1 may include a first red sub-pixel for emitting red light ray, a first green sub-pixel for emitting green light ray, and a first blue sub-pixel for emitting blue light ray.

Figure 5A:
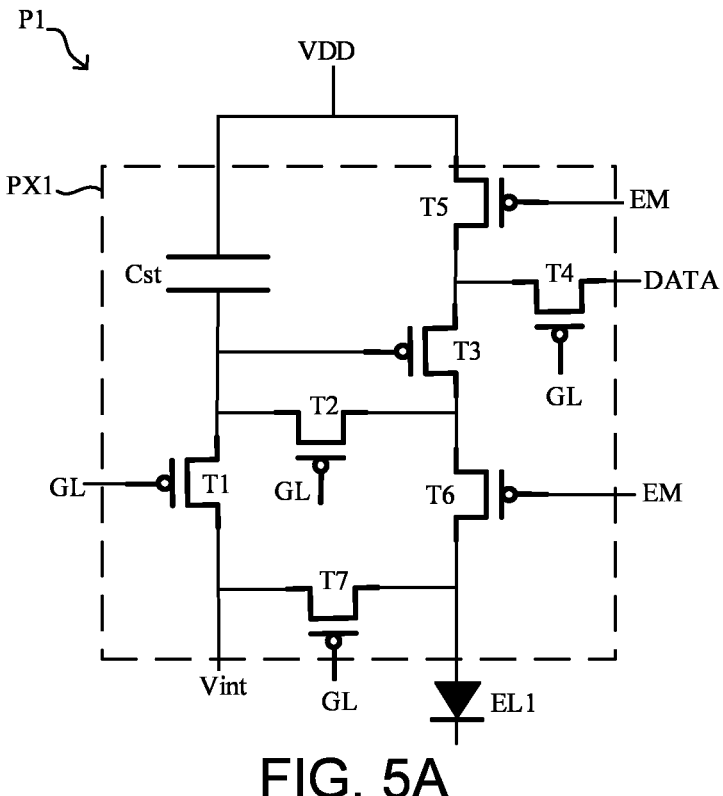
FIG. 5A is an equivalent circuit diagram of a first sub-pixel, in accordance with some embodiments.

Referring to FIG. 5A, for example, the first sub-pixel P1 may include a first pixel circuit PX1 and a first light-emitting device EL1. The first pixel circuit PX1 includes at least one storage capacitor and a plurality of thin film transistors. For example, the first pixel circuit PX1 may be a "7T1C" circuit, a "7T2C" circuit, a "3T1C" circuit, a "5T1C" circuit, or the like, where "T" refers to the thin film transistor, and a number before "T" refers to a number of thin film transistors; "C" refers to the storage capacitor, and a number before "C" refers to a number of storage capacitors. For example, the first light-emitting device EL1 may be OLED or QLED. FIG. 5A shows an example in which the first pixel circuit PX1 is a "7T1C" circuit having seven thin film transistors T1 to T7, and one storage capacitor Cst.

The first display portion 110 has arc-shaped border(s) 111. The arc-shaped border 111 is capable of adapting to different shapes of the display apparatus 1000, making the display apparatus 1000 rich in form and suitable for different application scenarios.

Figure 1B:
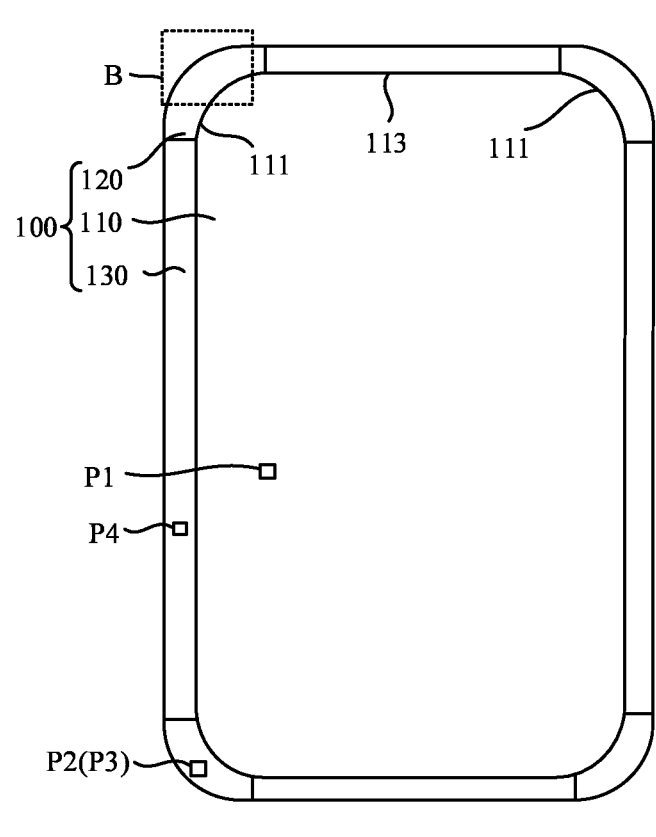
FIG. 1B is a structural diagram of another display panel in a flattened state, in accordance with some embodiments.

For example, referring to FIG. 1A and FIG. 1B, the arc-shaped borders 111 may each be located at a corner of the first display portion 110 to form arc-shaped corners of the display panel 100. In this way, referring to FIG. 2, for example, the display panel 100 may be used to form a display apparatus 1000 having rounded corners, where the rounded corners are curved surfaces (hyperbolic curved surfaces), for example, a mobile phone with curved surfaces all around (each curved surface at a corner is formed by a second display portion 120). FIG. 1A and FIG. 1B are structural diagrams of the display panel laid on a reference plane, and FIG. 2 is a structural diagram of the second display portions 120 of the display panel laid on the reference curved surface RS of the substrate 200.

Figure 3:
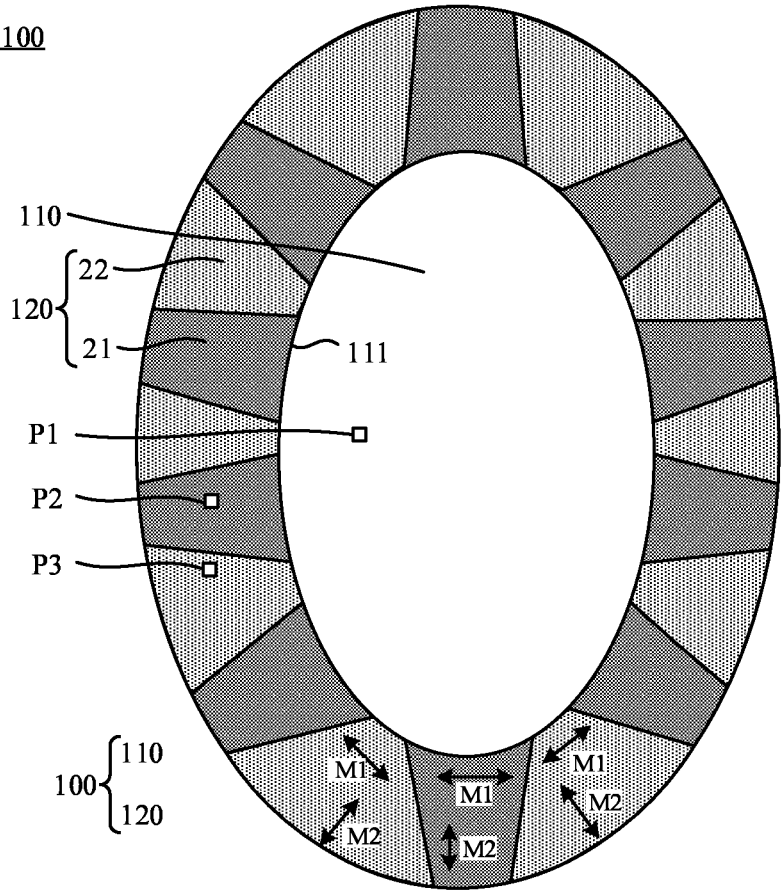
FIG. 3 is a structural diagram of yet another display panel in a flattened state, in accordance with some embodiments.
Figure 4:
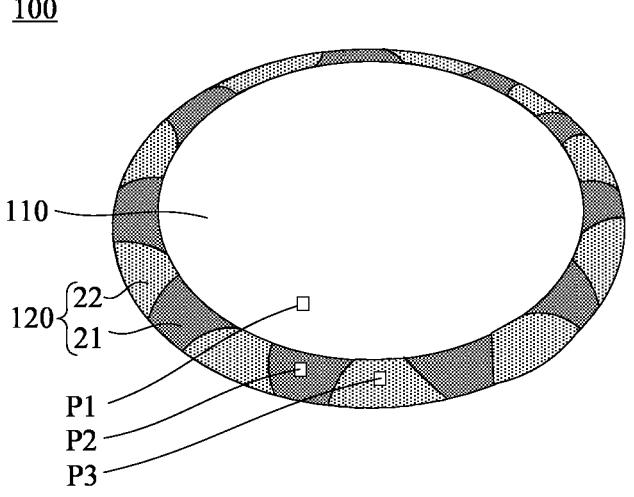
FIG. 4 is a structural diagram of another display panel in which a curved surface is formed, in accordance with some embodiments.

For example, referring to FIG. 3, the arc-shaped border 111 may alternatively have a closed shape connected end to end, so that a shape of the first display portion 110 is a closed-shape enclosed by the arc-shaped border 111. For example, the arc-shaped border 111 may be in a shape of a circle, an ellipse or other irregular arc. In this way, referring to FIG. 4, for example, the display panel 100 may be used to form a circular, or substantially circular, or spherical display apparatus. For example, the display panel 100 may be used to form a display screen of a circular watch, and a whole edge of the circular watch is a curved surface (a curved surface of the edge is formed by the second display portion 120). FIG. 3 is a structural diagram of the second display portion 120 laid on a reference plane, and FIG. 4 is a structural diagram of the second display portion 120 laid on the reference curved surface of the substrate.

The second display portion 120 is laid on the reference curved surface of the substrate, and is configured to form a curved surface (hyperbolic curved surface) having a same shape as the reference curved surface.

Referring to FIG. 1A and FIG. 1B, each second display portion 120 is connected to an arc-shaped border 111 of the first display portion 110. That is, the second display portion 120 is configured to provide a border of the display panel 100. The second display portion 120 includes a plurality of first sub-portions 21 and at least one second sub-portion 22 (as shown in FIG. 6A and FIG. 6B).

The first sub-portion 21 includes a plurality of second sub-pixels P2, and a structure of the second sub-pixel P2 may be same as that of the first sub-pixel P1, which will not be repeated here.

Figure 6A:
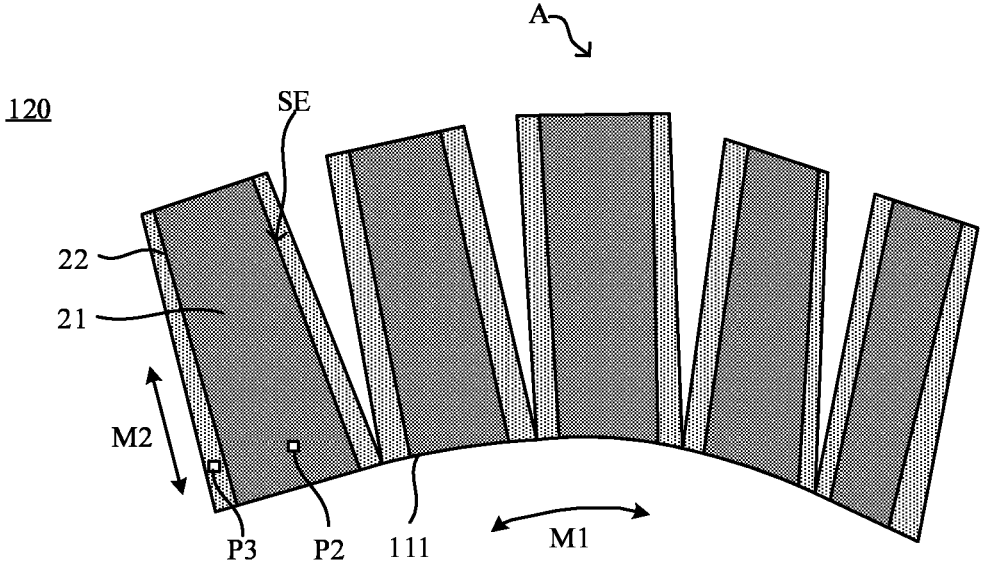
FIG. 6A is a partial enlargement view of the region A in FIG. 1A.
Figure 6B:
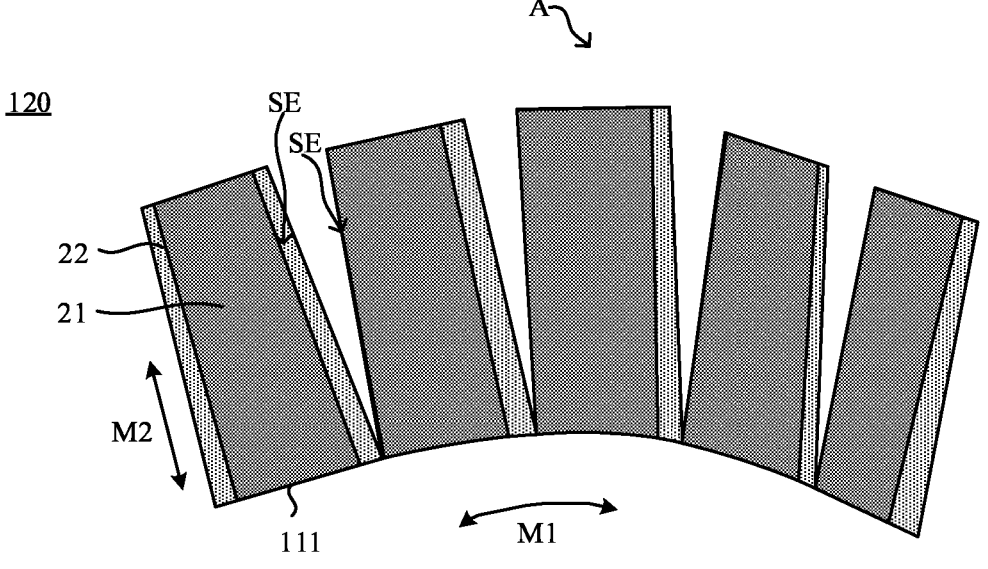
FIG. 6B is another partial enlargement view of the region A in FIG. 1A.

Referring to FIG. 6A and FIG. 6B, the plurality of first sub-portions 21 are sequentially arranged along the arc-shaped border 111, that is, the plurality of first sub-portions 21 are sequentially arranged along an extending direction of the arc-shaped border 111. In a case where the first display portion 110 and the second display portion 120 are laid on a reference plane, any two adjacent first sub-portions 21 have a gap therebetween.

It can be understood that the reference plane can be any plane, and the first display portion 110 and the second display portion 120 are laid on the reference plane. That is, the first display portion 110 and the second display portion 120 are in a flattened state without bending, curling, etc., or the first display portion 110 and the second display portion 120 are in a state where areas of orthographic projection of the first display portion 110 and the second display portion 120 on the reference plane each reach the maximum.

As shown in FIG. 3 and FIG. 4, the second sub-portion 22 includes a plurality of third sub-pixels P3. A structure of the third sub-pixel P3 is same as that of the first sub-pixel P1, which will not be repeated here. Since the first sub-portion 21 includes the second sub-pixels P2 and the second sub-portion 22 includes the third sub-pixels P3, both the first sub-portion 21 and the second sub-portion are capable of displaying image information, so that the second display portion 120 is capable of displaying image information.

At least one second sub-portion 22 is located between two adjacent first sub-portions 21 and is connected to at least one first sub-portion 21. That is, at least one second sub-portion 22 exists between two adjacent first sub-portion 21. For example, at least one (one or two) second sub-portion 22 is provided between every two adjacent first sub-portions 21.

A Young's modulus of the first sub-portion 21 is greater than a Young's modulus of the second sub-portion 22. That is, compared with the first sub-portion 21, the second sub-portion 22 has a smaller Young's modulus, and the second sub-portion 22 is capable of generating certain deformation, such as stretching deformation and compressive deformation. During a process of forming the curved surface on the second display portion 120, a shape of the second sub-portion 22 can be adjusted by stretching or compressing the second sub-portion 22, so that the second sub-portion 22 can fill the gap between the first sub-portions 21, and do not overlap with adjacent first sub-portions 21. It is beneficial to reduce the risk of abnormal display of the display panel 100, improve the reliability of the curved region of the display panel 100, and improve the reliability of the display apparatus 1000.

For example, in the case where the second display portion 120 is laid on the reference plane, a size of the gap between two adjacent first sub-portions 21 can be designed, so that after the second display portion 120 forms the curved surface, the two adjacent first sub-portions 21 still have a preset gap therebetween. And it is designed that a second sub-portion 22 located between the two adjacent first sub-portions 21 is capable of filling the preset gap after forming the curved surface, and the two adjacent first sub-portions 21 have no overlapping region therebetween. In this way, in the process of forming the curved surface on the second display portion 120, even if the gap between the two adjacent first sub-portions 21 has a deviation (such as a deviation caused by the influence of measurement accuracy, processing error, alignment accuracy, etc.), it is possible to adapt to the above-mentioned deviation through the deformation of the second sub-portion 22.

For example, in a case where an actual gap between the two first sub-portions 21 is greater than the preset gap, the second sub-portion 22 can be stretched along a first direction M1 to increase a width of the second sub-portion 22 (a dimension thereof along the first direction M1), so that the second sub-portion 22 can still fill the gap between the two first sub-portions 21. Conversely, in a case where the actual gap between the two first sub-portions 21 is less than the preset gap, the second sub-portion 22 can be stretched along a second direction M2 to reduce the width of the second sub-portion 22, thereby avoiding overlapping between the first sub-portion 21 and the second sub-portion 22.

In some embodiments, in the case where the first display portion 110 and the second display portion 120 are laid on the reference plane, dimension(s) of second sub-portion(s) 22 along the first direction M1 is less than or equal to a dimension of a gap between two first sub-portions adjacent thereto along the first direction M1.

Referring to FIG. 6A, in a case where the dimension(s) of the second sub-portion(s) 22 along the first direction M1 is less than the dimension of the gap between the two adjacent first sub-portions 21 along the first direction M1, there may be two second sub-portions 22 between the two adjacent first sub-portions 21, each second sub-portion 22 is connected to a side edge SE of a first sub-portion 21 adjacent to, and the two second sub-portions 22 have a gap therebetween.

Referring to FIG. 6B, there may alternatively be one second sub-portion 22 between the two adjacent first sub-portions 21, the one second sub-portion 22 is connected to a side edge SE of one of the two adjacent first sub-portions 21, and have a gap with a side edge SE of the other first sub-portion 21.

In this way, in a case where the second display portion 120 is attached to the reference curved surface by generating compressive deformation, the above-mentioned gap may provide a large compressive space for the second display portion 120, which is beneficial to attach the second display portion 120 to a reference curved surface with a large curvature and a large curved surface area.

For example, referring to FIG. 6A, in a case where two second sub-portions 22 are provided between two adjacent first sub-portions 21, along the second direction M2 and away from the first display portion 110, a dimension of a gap between the two second sub-portions 22 along the first direction M1 may gradually increase. In this way, it is more beneficial to lay the second display portion 120 on the reference curved surface.

Figure 7A:
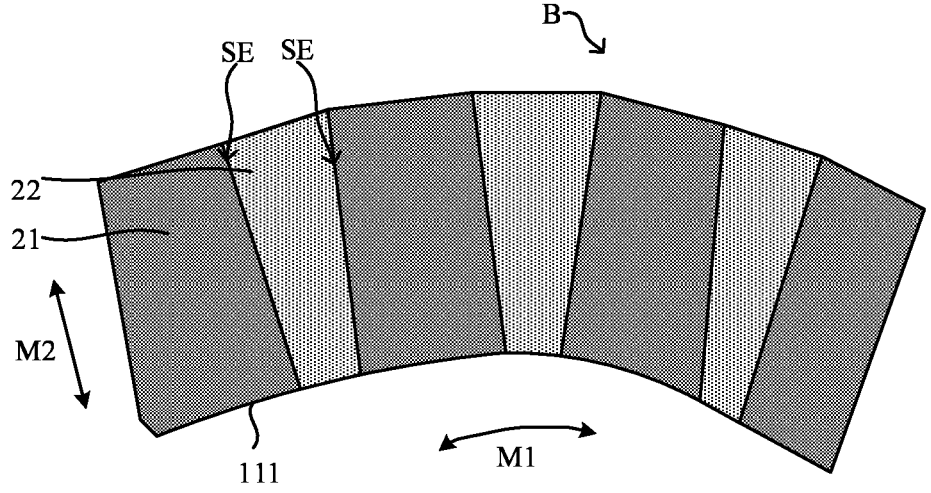
FIG. 7A is a partial enlargement view of the region B in FIG. 1B.
Figure 7B:
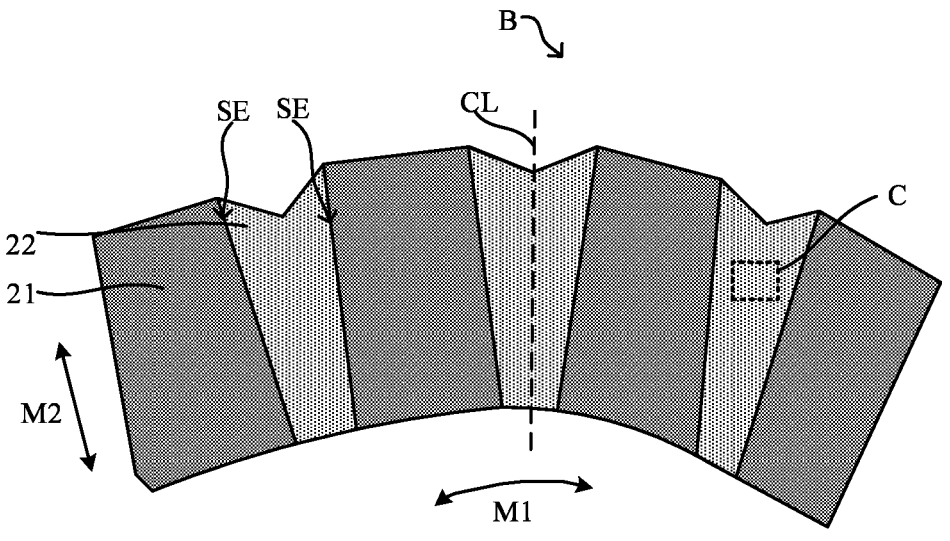
FIG. 7B is another partial enlargement view of the region B in FIG. 1B.

In a case where the dimension(s) of the second sub-portion(s) 22 along the first direction M1 is equal to the dimension of the gap between the two adjacent first sub-portions 21 along the first direction M1, that is, in the case where the second display portion 120 is laid on the reference plane, referring to FIG. 1B, FIG. 7A and FIG. 7B, two sides of one second sub-portion 22 are respectively connected with side edges SE of the two adjacent first sub-portions 21, that is, the one second sub-portion 22 is provided between the two adjacent first sub-portions 21. In this way, in a case where the second display portion 120 is attached to the curved surface by generating stretching deformation, the second sub-portion 22 is capable of generating a great amount of stretching, which is more conducive to the attaching of the second display portion 120 to the reference curved surface.

An analysis of the process of forming the curved surface on the second display portion 120 shows that the farther a region of the second display portion 120 from the first display portion 110 is, the larger the amount of deformation needs to be generated in a case of forming the curved surface. It can be understood that in the following embodiments of the present disclosure, unless otherwise specified, the term "deformation" may include at least one of stretching deformation and compressive deformation.

Based on the above reasons, in some embodiments, referring to FIG. 7A, in a case where one second sub-portion 22 is provided between two adjacent first sub-portions 21, and the second sub-portion 22 is connected with two side edges, proximate to each other, of the two adjacent first sub-portions 21, along the second direction M2 and away from the first display portion 110, a dimension of the second sub-portion 22 along the first direction M1 gradually increases. That is, along the second direction M2 and away from the first display portion 110, a dimension of a gap between the two adjacent first sub-portions 21 along the first direction M1 gradually increases. In this way, along the second direction M2 and away from the first display portion 110, the amount of deformation that can be produced by the second sub-portion 22 gradually increases, and further the amount of deformation that can be produced by an end of the second display portion 120 away from the first display portion 110 increases, which is beneficial for the second display portion 120 to be attached to the reference curved surface (to form a preset curved surface).

For example, along the second direction M2 and away from the first display portion, a dimension of the first sub-portion 21 along the first direction M1 is substantially constant (as shown in FIG. 6A and FIG. 6B) or gradually decreases (as shown in FIG. 3 and FIG. 7A). In this way, along the second direction M2 and away from the first display portion 110, the dimension of the gap between the two adjacent first sub-portions 21 along the first direction M1 gradually increases.

Here, the first direction M1 is substantially parallel to a tangential direction of the arc-shaped border 111, and the second direction M2 is substantially parallel to a radial direction of the arc-shaped border 111. It can be understood that since the arc-shaped border 111 is arc-shaped, the first direction M1 at different positions of the second display portion 120 is not uniquely fixed, that is, the first direction M1 at different positions may be different.

Figure 8:
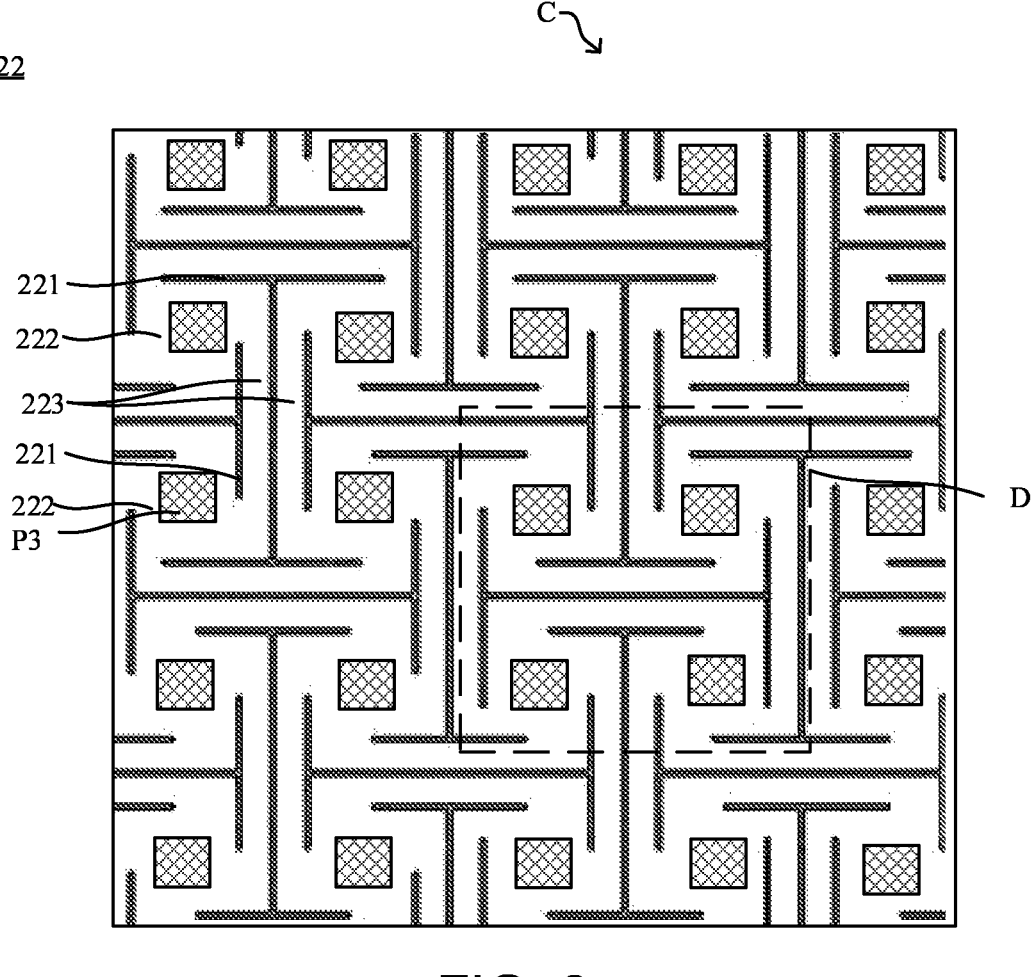
FIG. 8 is a partial enlargement view of the region C in FIG. 7B.

In some embodiments, referring to FIG. 8, the second sub-portion 22 is provided therein with a plurality of opening holes 221, and the plurality of opening holes 221 are located between the plurality of third sub-pixels P3. In this way, by providing the opening holes 221 in the second sub-portion 22, the Young's modulus of the second sub-portion 22 is reduced, and the deformability that the second sub-portion 22 can produce is improved. The opening holes 221 are arranged between the plurality of third sub-pixels P3, which may reduce the influence of the opening holes 221 on the arrangement space of the third sub-pixels P3.

Figure 9:
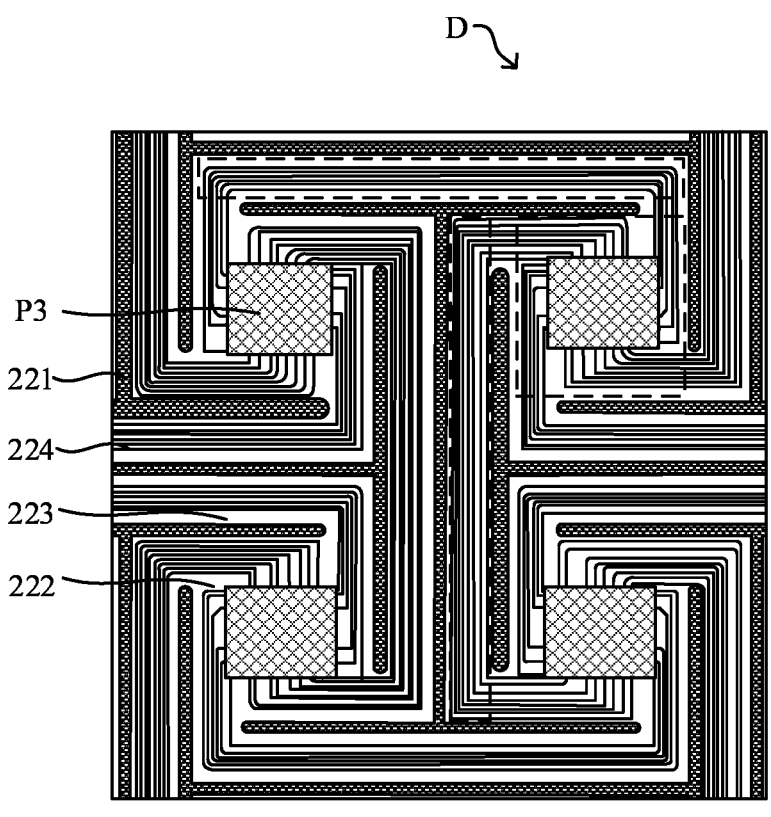
FIG. 9 is a partial enlargement view of the region D in FIG. 8.

In some embodiments, referring to FIG. 9, the second sub-portion 22 has a plurality of island regions 222 and a plurality of bridge regions 223. Two adjacent island regions 222 are connected by at least one bridge region 223. The opening holes 221 may be arranged between adjacent island regions 222, between adjacent bridge regions 223, and between island regions 222 and bridge regions 223 that are adjacent. For example, the opening hole 221 may have an "H" shape.

The plurality of third sub-pixels P3 are distributed in the plurality of island regions 222. The island regions 222 may provide sufficient arrangement space for the third sub-pixels P3.

For example, the plurality of island regions 222 are arranged in an array, and every two adjacent island regions 222 are connected by a bridge region 223 therebetween to realize the connection between the island regions 222, thus ensuring the structural integrity of the display panel 100. For example, every two adjacent island regions 222 are connected by one bridge region 223 therebetween.

For example, each island region 222 is provided with at least one third sub-pixel P3 therein. For example, each island region 222 is provided with one third sub-pixel P3 therein, and the third sub-pixel P3 in each island region 222 includes one of a third red sub-pixel for emitting red light ray, a third green sub-pixel emitting green light ray, and a third blue sub-pixel for emitting blue light ray.

Referring to FIG. 9, the second sub-portion 22 further includes a plurality of signal lines 224, and each third sub-pixel P3 is electrically connected to at least one signal line 224. The at least one signal line 224 is distributed in multiple bridge regions 223. The at least one signal line 224 extends along the bridge regions 223 to an island region 222 connected to the bridge regions 223, so that the bridge regions 223 provide a wiring region for the at least one signal line 224. The at least one signal line 224 is configured to transmit a voltage signal to at least one third sub-pixel P3 electrically connected thereto, so as to control or drive the at least one third sub-pixel P3 to emit light.

In some embodiments, referring to FIG. 1A and FIG. 1B, the first display portion 110 has a plurality of corners 112, and a border of each corner 112 is an arc-shaped border 111. The display panel 100 includes a plurality of second display portions 120, and each second display portion 120 is connected to an arc-shaped border 111 of a corner 112.

For example, a shape of the first display portion 110 may be a rectangle or substantially a rectangle, so that the first display portion 110 may have four corners 112. The borders of the four corners 112 are all arc-shaped borders 111. Based on this, the display panel 100 may include four second display portions 120, and the four second display portions 120 are each connected to one corner 112.

The first display portion 110 further has a plurality of straight-line borders 113, and two adjacent arc-shaped borders 111 are connected by a straight-line border 113 therebetween. That is, the straight-line borders 113 and the arc-shaped borders 111 are arranged alternately and connected in sequence.

The display panel 100 further includes a plurality of third display portions 130, and each third display portion 130 is connected to a straight-line border 113. For example, the third display portion 130 can be bent to form a curved surface, and two ends of the third display portion along an extending direction of a straight-line border 113 where the third display portion is located are respectively connected to curved surfaces formed by two second display portions 120.

It can be understood that the curved surface formed by the third display portion 130 can be a ruled curved surface (a curved surface obtained by revolving a straight line along a certain trajectory), and the curved surface formed by the second display portion 120 can be a hyperbolic surface (a curved surface obtained by revolving a curve along a certain trajectory).

In a case where the first display portion 110, the second display portion 120, and the third display portion 130 are laid on the reference plane, that is, in a case where the entire display panel 100 is laid on the reference plane, a second display portion 120 and a third display portion 130 adjacent thereto have a gap therebetween. In this way, a risk of mutual interference during the process of forming curved surfaces on the second display portion 120 and the third display portion 130 may be reduced, which is beneficial to a formation of respective curved surfaces of the second display portion 120 and the third display portion 130.

In some embodiments, an edge of a second display portion 120 proximate to a third display portion 130 can be a second sub-portion 22, so that the second sub-portion 22 can fill a gap between the second display portion 120 and the third display portion 130 through deformation, which is beneficial for the second display portion 120 and the third display portion 130 to form curved surfaces without gaps and without overlapping.

The third display portion 130 includes a plurality of fourth sub-pixels P4. A structure of the fourth sub-pixel P4 may be same as that of the first sub-pixel P1, and embodiments of the present disclosure will not describe the fourth sub-pixel P4 in detail.

In some embodiments, referring to FIG. 1B and FIG. 7B, there exists a case where a second display portion 120 is arranged at a corner of the first display portion 110, a second sub-portion 22 is arranged between two adjacent first sub-portions 21, and the second sub-portion 22 is connected to two side edges, proximate to each other, of the two adjacent first sub-portions 21. In this case, along the first direction M1 and from each of the two adjacent first sub-portions 21 to a center line (as shown in FIG. 7B with "CL") of the second sub-portion 22, a dimension of the second sub-portion 22 along the second direction M2 gradually decreases. That is, along the first direction M1, a dimension of a middle part of the second sub-portion along the second direction M2 is less than a dimension of a part thereof at each of both sides along the second direction M2. A curved surface formed on the second sub-portion 22 will produce stretching deformation along the second direction M2; along the first direction M1 and from each of the two adjacent first sub-portions 21 to the center line CL of the second sub-portion 22, the dimension of the second sub-portion 22 along the second direction M2 gradually becomes smaller, so that after curved surfaces are formed on second sub-portions 22, ends of the second sub-portions away from the first display portion 110 are substantially flush, and thus edges of the display apparatus 1000 are substantially flush.

In some embodiments, referring to FIG. 7B, along the first direction M1 and from each of the two adjacent first sub-portions 21 to the center line of the second sub-portion 22, the dimension of the second sub-portion 22 along the second direction M2 gradually decreases, a border of the second sub-portion 22 away from the first display portion 110 has a V-shape or an arc-shape, and the V-shape or the arc-shape is concave along a direction proximate to the arc-shaped border 111.

In some embodiments, referring to FIG. 3, in a case where the shape of the first display portion 110 is the closed-shape enclosed by the arc-shaped border 111, that is, the arc-shaped border 111 has the closed shape connected end to end, the plurality of first sub-portions 21 and the at least one second sub-portion 22 are arranged alternately around the first display portion 110 and connected in sequence, where the at least one second sub-portion 22 includes a plurality of second sub-portions.

In a process of laying the second display portion 120 on the reference curved surface, in a case where the second sub-portion 22 is required to produce stretching deformation along the first direction M1, along the first direction M1 and from each of the two adjacent first sub-portions 21 to the center line of the second sub-portion 22, a dimension of the second sub-portion 22 along the second direction M2 may also be set to become gradually larger. In this way, it is also beneficial for the display apparatus 1000 to have edges that are substantially flush.

For example, referring to FIG. 3, there exists a case where a border of the first display portion 110 is enclosed by the arc-shaped border 111, a second sub-portion 22 is arranged between two adjacent first sub-portions 21, and the second sub-portion 22 is connected to two side edges, proximate to each other, of the two adjacent first sub-portions 21. In this case, a border of the second sub-portion 22 away from the first display portion 110 has a V-shape or an arc-shape, and the V-shape or the arc-shape is convex along a direction away from the arc-shaped border 111. FIG. 3 shows an example in which the border of the second sub-portion 22 away from the first display portion 110 has an arc-shape.

In some embodiments, referring to FIG. 3, along the second direction M2 and away from the first display portion 110, a dimension of a gap between two adjacent first sub-portions 21 along the first direction M1 gradually increases. One second sub-portion 22 is arranged between the two adjacent first sub-portions 21, and the one second sub-portion 22 is connected to two side edges, proximate to each other, of the two adjacent first sub-portions 21, that is, in the case where the second display portion 120 is laid on the reference plane, the second sub-portion 22 fills up the gap between the two adjacent first sub-portions 21. A shape of an end of the second sub-portion 22 away from the first display portion 110 is substantially same as that of the arc-shaped border 111. For example, the end of the second sub-portion 22 away from the first display portion 110 is in an arc-shaped shape convex toward a side away from the first display portion 110.

In some embodiments, a third pixel circuit PX3 of at least one third sub-pixel P3 is arranged in the first display portion 110 or a first sub-portion 21 (adjacent to a second sub-portion 22 where the third sub-pixel P3 is located). In this way, it is beneficial to further reduce the Young's modulus of the second sub-portion 22 and improve the ability of the second sub-portion 22 to generate deformation.

For example, third pixel circuits of some third sub-pixels P3 in the second sub-portion 22 proximate to the first sub-portion 21 are arranged in the first sub-portion 21 adjacent thereto; and third pixel circuit(s) of third sub-pixel (s) P3 in the second sub-portion 22 proximate to the first display portion 110 is arranged in a region of the first display portion 110 adjacent to the second sub-portion 22 where the third sub-pixel(s) P3 is located. Third pixel circuits of some of third sub-pixels P3 in the second sub-portion 22 may also be arranged in the second sub-portion 22.

Figure 5B:
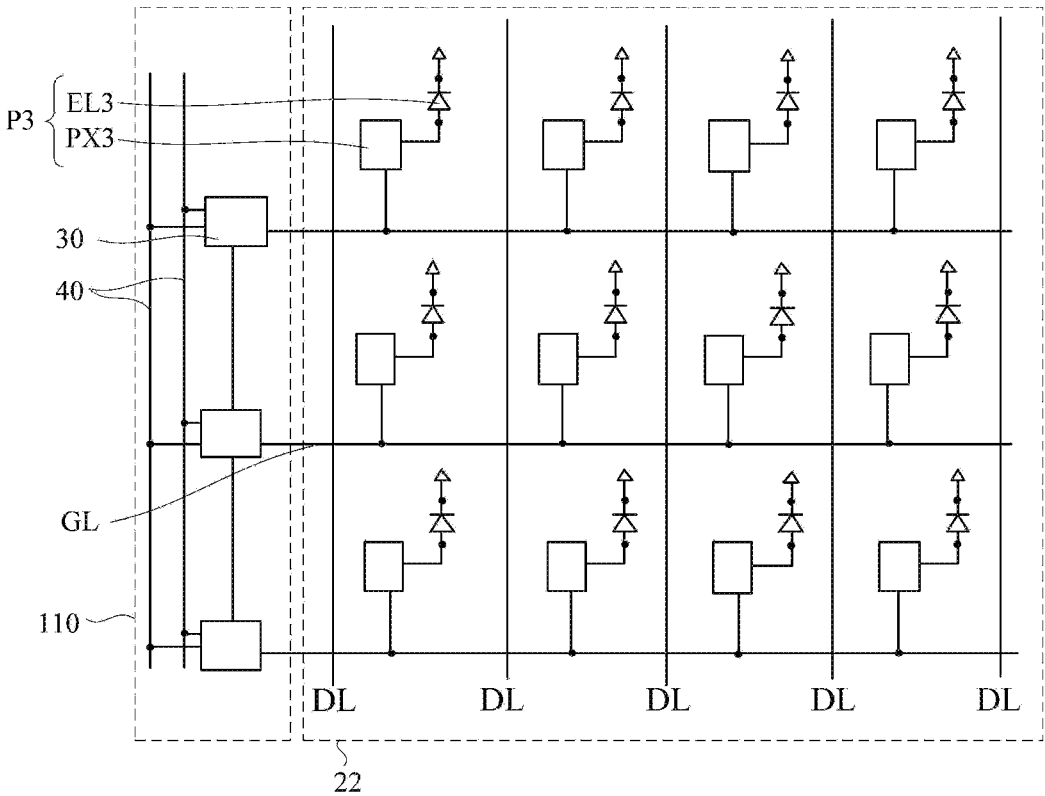
FIG. 5B is a structural diagram of a third sub-pixel and a third scanning circuit, in accordance with some embodiments.

For a third pixel circuit arranged in the first sub-portion 21 or the first display portion 110, the third pixel circuit is electrically connected to a third light-emitting device (as shown in FIG. 5B with "EL3") in the second sub-portion 22 through a connection line.

In some embodiments, as shown in FIG. 5B, the display panel 100 includes a plurality of scanning circuits (hereinafter referred to as third scanning circuits) 30 and a plurality of control signal lines (hereinafter referred to as third control signal lines) 40. Each third scanning circuit 30 is electrically connected to at least one third sub-pixel P3, and the third scanning circuit 30 is configured to turn on or off the at least one third sub-pixel P3.

For example, the third scanning circuit 30 may be a shift register circuit (gate on array (GOA) circuit), which is configured to output a scanning signal to a third pixel circuit PX3. The scanning signal may be, for example, a gate signal for a data writing transistor to control the data writing transistor to be turned on or off, and then the third pixel circuit is turned on or off, so as to realize the purpose of turning on or off the third sub-pixel P3.

The plurality of third control signal lines 40 are electrically connected to the third scanning circuits 30, and the plurality of third control signal lines 40 are configured to provide signals required for operation to the third scanning circuits 30. For example, the third control signal line 40 may include, for example, at least one of a clock control signal line, a start (STV) signal line, a high-level constant voltage (VGH) signal line and a low-level constant voltage (VGL) signal line. The third scanning circuits 30 are controlled by the plurality of third control signal lines 40 to output scanning signals to the outside.

At least one third scanning circuit 30 is arranged in the first display portion 110 and/or the first sub-portion 21, so that a pattern area of a conductive layer in the second sub-portion 22 may be reduced, and a number of circuits included in the second sub-portion 22 may be reduced, which is beneficial to reduce the Young's modulus of the second sub-portion 22, and moreover, it is beneficial to reduce the difficulty of arranging opening holes in the second sub-portion 22, and reduce the influence of the opening holes on the arrangement space of the third scanning circuit 30.

For example, at least one third scanning circuit 30 is arranged in the first display portion 110 (as shown in FIG. 5B). Alternatively, at least one third scanning circuit 30 is arranged in the first sub-portion 21. Alternatively, a part of the third scanning circuits 30 is arranged in the first display portion 110, and the other part of the third scanning circuits 30 is arranged in the first sub-portion 21.

And/or, at least one third control signal line 40 is arranged in the first display portion 110 and/or the first sub-portion 21, so that the wiring arrangement on the second sub-portion 22 may be simplified, which is beneficial to reduce the Young's modulus of the second sub-portion 22, and moreover, it is beneficial to reduce the difficulty of arranging opening holes in the second sub-portion 22, and reduce the influence of the opening holes on the arrangement space of the third control signal line 40. For example, as shown in FIG. 5B, the third control signal lines 40 are arranged in the first display portion 110.

For example, at least one third control signal line 40 is arranged in the first display portion 110 (as shown in FIG. 5B). Alternatively, at least one third control signal line 40 is arranged in the first sub-portion 21. Alternatively, a part of the third control signal lines 40 is arranged in the first display portion 110, and the other part of the third control signal lines 40 is arranged in the first sub-portion 21.

It can be understood that the third control signal lines 40 need to be electrically connected to the third scanning circuits 30, therefore, a region where the third scanning circuits 30 are provided may be provided therein with the third control signal lines 40, which is beneficial to the third control signal lines 40 to transmit control signals to the third scanning circuits 30. Alternatively, the third control signal lines 40 may be provided in a region where the third scanning circuits 30 are not provided, such as in a peripheral region of the display panel 100 (a region where image information is not displayed), so as to connect with an external chip (such as a timing control chip (TCON-IC)) and a circuit board (such as a driver circuit board (Source PCB)).

In some embodiments, the Young's modulus of the first sub-portion 21 is less than or equal to the Young's modulus of the first display portion 110, that is, a structure of the first sub-portion 21 may be same as that of the first display portion 110. In this way, the Young's modulus of the first sub-portion 21 and the first display portion 110 are substantially equal.

In the case where the second display portion 120 (the first sub-portions 21 and the second sub-portion(s) 22) is laid on the reference plane, borders, away from the first display portion 110, of the plurality of first sub-portions 21 and the at least one second sub-portion 22 are approximately in a same plane. That is, two ends, proximate to each other, of a first sub-portion 21 and a second sub-portion 22 that are adjacent are approximately flush. In this way, after the second display portion 120 is laid on the reference curved surface, a border the second display portion 120 is continuous, and transitions smoothly at a position where the first sub-portion 21 and the second sub-portion 22 are connected.

The above description is only specific embodiments of the present disclosure, but the scope of protection of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
a first display portion, including a plurality of first sub-pixels and having at least one arc-shaped border; and
at least one second display portion, each connected to an arc-shaped border of the at least one arc-shaped border in the first display portion and including:
a plurality of first sub-portions each including a plurality of second sub-pixels, wherein the plurality of first sub-portions are sequentially arranged along the arc-shaped border of the at least one arc-shaped border, and in a case where the first display portion and the at least one second display portion are laid on a reference plane, any two adjacent first sub-portions of the plurality of first sub-portions have a gap therebetween; and
one or more second sub-portions each including a plurality of third sub-pixels, wherein at least one second sub-portion of the one or more second sub-portions is located in a gap between two adjacent first sub-portions of the plurality of first sub-portions and is connected to at least one of the two adjacent first sub-portions of the plurality of first sub-portions;
wherein a Young's modulus of each first sub-portion of the plurality of first sub-portions is greater than a Young's modulus of each second sub-portion of the one or more second sub-portions; and
a second sub-portion of the one or more second sub-portions is provided therein with a plurality of opening holes, and the plurality of opening holes are located between the plurality of third sub-pixels.

2. The display panel according to claim 1, wherein a dimension of the at least one second sub-portion along a first direction is less than or equal to a dimension of the gap between the two adjacent first sub-portions of the plurality of first sub-portions along the first direction, wherein the first direction is parallel to a tangential direction of the arc-shaped border of the at least one arc-shaped border.

3. The display panel according to claim 1, wherein the second sub-portion of the one or more second sub-portions has a plurality of island regions and a plurality of bridge regions, and two adjacent island regions of the plurality of island regions are connected by at least one bridge region of the plurality of bridge regions therebetween; and the plurality of opening holes are arranged between adjacent island regions, between adjacent bridge regions, and between island regions and bridge regions that are adjacent;
the plurality of third sub-pixels are distributed in the plurality of island regions; and
the second sub-portion of the one or more second sub-portions further includes a plurality of signal lines, each third sub-pixel of the plurality of third sub-pixels is electrically connected to at least one signal line, and the plurality of signal lines are distributed in the plurality of bridge regions.

4. The display panel according to claim 1, wherein at least one second sub-portion includes one second sub-portion, the one second sub-portion is arranged between the two adjacent first sub-portions, and the one second sub-portion is connected to two side edges, proximate to each other, of the two adjacent first sub-portions.

5. The display panel according to claim 4, wherein along a second direction and away from the first display portion, a dimension of the one second sub-portion along a first direction increases, wherein the first direction is parallel to a tangential direction of the arc-shaped border of the at least one arc-shaped border, and the second direction is parallel to a radial direction of the arc-shaped border of the at least one arc-shaped border.

6. The display panel according to claim 4, wherein along a first direction and from each of the two adjacent first sub-portions to a center line of the one second sub-portion, a dimension of the one second sub-portion along a second direction decreases, wherein the first direction is parallel to a tangential direction of the arc-shaped border of the at least one arc-shaped border, and the second direction is parallel to a radial direction of the arc-shaped border of the at least one arc-shaped border.

7. The display panel according to claim 6, wherein a border of the one second sub-portion away from the first display portion has a V-shape or an arc-shape, and along a direction from the border of the second sub-portion to the arc-shaped border of the at least one arc-shaped border, the border of the second sub-portion is concave.

8. The display panel according to claim 4, wherein the at least one arc-shaped border includes one arc-shaped border, and the at least one second display portion includes one second display portion; and a shape of the first display portion is a closed-shape enclosed by the one arc-shaped border, and the plurality of first sub-portions and the one or more second sub-portions are arranged alternately around the first display portion and connected in sequence.

9. The display panel according to claim 8, wherein a border, away from the first display portion, of each sub-portion among the plurality of first sub-portions and the one or more second sub-portions have an arc-shape, and along a direction from the arc-shaped border of the at least one arc-shaped border to the border of each sub-portion, the border of each sub-portion is convex.

10. The display panel according to claim 1, wherein at least one second sub-portion includes two second sub-portions, the two second sub-portions are arranged between the two adjacent first sub-portions, and each second sub-portion of the two second sub-portions is connected to a first sub-portion, of the plurality of first sub-portions, adjacent thereto; and in the case where the first display portion and the at least one second display portion are laid on the reference plane, the two second sub-portions have a gap therebetween.

11. The display panel according to claim 10, wherein along a second direction and away from the first display portion, a dimension of the gap between the two second sub-portions along a first direction increases, wherein the first direction is parallel to a tangential direction of the arc-shaped border of the at least one arc-shaped border, and the second direction is parallel to a radial direction of the arc-shaped border of the at least one arc-shaped border.

12. The display panel according to claim 10, wherein a dimension of the first sub-portion of the plurality of first sub-portions along a first direction is constant, wherein the first direction is parallel to a tangential direction of the arc-shaped border of the at least one arc-shaped border.

13. The display panel according to claim 1, wherein the first display portion has a plurality of corners, and a border of each corner is the arc-shaped border of the at least one arc-shaped border; the at least one second display portion includes a plurality of second display portions, each second display portion of the plurality of second display portions is connected to an arc-shaped border of one of the plurality of corners;

the first display portion further has a plurality of straight-line borders, the at least one arc-shaped border includes a plurality of arc-shaped borders, and two adjacent arc-shaped borders of the plurality of arc-shaped borders are connected by a straight-line border of the plurality of straight-line borders therebetween; and the display panel further comprises a plurality of third display portions, each third display portion of the plurality of third display portions is connected to a straight-line border of the plurality of straight-line borders; and in a case where the first display portion, the second display portions and the third display portions are laid on the reference plane, a second display portion and a third display portion adjacent thereto have a gap therebetween; and the third display portions each include a plurality of fourth sub-pixels.

14. The display panel according to claim 1, wherein each third sub-pixel of the plurality of third sub-pixels includes a third light-emitting device and a third pixel circuit electrically connected to the third light-emitting device; and at least one third pixel circuit of a plurality of third pixel circuits is arranged in the first display portion and/or a first sub-portion.

15. The display panel according to claim 1, further comprising a plurality of scanning circuits and a plurality of control signal lines, wherein each scanning circuit of the plurality of scanning circuits is electrically connected to at least one third sub-pixel, and the each scanning circuit is configured to turn on or turn off the at least one third sub-pixel;

the plurality of control signal lines are electrically connected to the plurality of scanning circuits, and the plurality of control signal lines are configured to transmit signals required for operation to the plurality of scanning circuits; and at least one scanning circuit of the plurality of scanning circuits is arranged in the first display portion and/or a first sub-portion, and/or at least one control signal line is arranged in the first display portion and/or a first sub-portion.

16. The display panel according to claim 1, wherein in a case where the at least one second display portion is laid on a reference curved surface, borders, away from the first display portion, of the plurality of first sub-portions and the one or more second sub-portions are located in a same plane.

17. The display panel according to claim 1, wherein a dimension of the first sub-portion of the plurality of first sub-portions along a first direction is constant, or along a second direction and from the first display portion to the first sub-portion of the plurality of first sub-portions, the dimension of the first sub-portion of the plurality of first sub-portions along the first direction decreases, wherein the first direction is parallel to a tangential direction of the arc-shaped border of the at least one arc-shaped border, and the second direction is parallel to a radial direction of the arc-shaped border of the at least one arc-shaped border.

18. The display panel according to claim 1, wherein the Young's modulus of the each first sub-portion of the plurality of first sub-portions is less than or equal to a Young's modulus of the first display portion.

19. A curved display apparatus, comprising:

the display panel according to claim 1; and a substrate, having a reference curved surface, wherein the display panel is laid on the substrate, and the at least one second display portion of the display panel is laid on the reference curved surface.

* * * * *